(12) United States Patent
Yamanaka et al.

(10) Patent No.: US 11,467,502 B2
(45) Date of Patent: Oct. 11, 2022

(54) WAVELENGTH CONTROL METHOD OF LASER APPARATUS AND ELECTRONIC DEVICE MANUFACTURING METHOD

(71) Applicant: Gigaphoton Inc., Tochigi (JP)

(72) Inventors: Takuma Yamanaka, Oyama (JP); Hirotaka Miyamoto, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 17/341,570

(22) Filed: Jun. 8, 2021

(65) Prior Publication Data

US 2021/0294223 A1 Sep. 23, 2021

Related U.S. Application Data

(63) Continuation of application No. PCT/JP2019/003041, filed on Jan. 29, 2019.

(51) Int. Cl.
*G03F 7/20* (2006.01)
*H01S 3/063* (2006.01)

(52) U.S. Cl.
CPC ........ *G03F 7/70575* (2013.01); *G03F 7/2041* (2013.01); *G03F 7/70025* (2013.01); *G03F 7/70341* (2013.01); *H01S 3/063* (2013.01)

(58) Field of Classification Search
CPC ............... G03F 7/2041; G03F 7/70025; G03F 7/70041; G03F 7/70341; G03F 7/70575; H01S 3/063; H01S 3/08004; H01S 3/08009; H01S 3/137; H01S 3/139; H01S 3/225

See application file for complete search history.

(56) References Cited

U.S. PATENT DOCUMENTS

| | | |
|---|---|---|
| 6,519,496 B1 | 2/2003 | Kawabe et al. |
| 9,261,794 B1 | 2/2016 | Ahlawat |
| 2001/0036207 A1 | 11/2001 | Nagai et al. |
| 2002/0141464 A1 | 10/2002 | Bushida et al. |
| 2011/0116522 A1 | 5/2011 | Riggs et al. |
| 2014/0247384 A1 | 9/2014 | Hokkezu et al. |
| 2015/0380893 A1 | 12/2015 | Matsunaga et al. |
| 2016/0299441 A1 | 10/2016 | Ahlawat |

(Continued)

FOREIGN PATENT DOCUMENTS

| | | |
|---|---|---|
| JP | H06-110554 A | 4/1994 |
| JP | H06-203395 A | 7/1994 |

(Continued)

OTHER PUBLICATIONS

International Search Report issued in PCT/JP2019/003041; dated May 7, 2019.

(Continued)

*Primary Examiner* — Peter B Kim
(74) *Attorney, Agent, or Firm* — Studebaker & Brackett PC

(57) ABSTRACT

A wavelength control method of a laser apparatus includes sequentially obtaining target wavelength data of a pulse laser beam, sequentially saving the target wavelength data, sequentially measuring a wavelength of the pulse laser beam to obtain a measured wavelength, calculating a wavelength deviation using the measured wavelength and the target wavelength data at a time before a time when the measured wavelength is obtained, and feedback-controlling the wavelength of the pulse laser beam using the wavelength deviation.

20 Claims, 10 Drawing Sheets

(56) References Cited

U.S. PATENT DOCUMENTS

2018/0159297 A1    6/2018    Ahlawat et al.
2018/0323568 A1*  11/2018  Furusato ............. H01S 3/08009

FOREIGN PATENT DOCUMENTS

| | | |
|---|---|---|
| JP | 2001-307997 A | 11/2001 |
| JP | 2013-511842 A | 4/2013 |
| JP | 2017-538963 A | 12/2017 |
| JP | 2018-517278 A | 6/2018 |
| WO | WO-9927664 A1 * | 6/1999 ........... H01S 5/0687 |
| WO | 2014/192704 A1 | 12/2014 |

OTHER PUBLICATIONS

International Preliminary Report on Patentability and Written Opinion issued in PCT/JP2019/003041; dated Jul. 27, 2021.

* cited by examiner

WAVELENGTH CONTROL METHOD OF LASER APPARATUS AND ELECTRONIC DEVICE MANUFACTURING METHOD

CROSS-REFERENCE TO RELATED APPLICATIONS

The present application is a continuation application of International Application No. PCT/JP2019/003041, filed on Jan. 29, 2019, the entire contents of which are hereby incorporated by reference.

BACKGROUND

1. Technical Field

The present disclosure relates to a wavelength control method of a laser apparatus and an electronic device manufacturing method.

2. Related Art

Recently, improvement in resolution of semiconductor exposure apparatuses (hereinafter referred to as "exposure apparatuses") has been desired due to miniaturization and high integration of semiconductor integrated circuits. For this purpose, exposure light sources that output light with shorter wavelengths have been developed. As the exposure light source, a gas laser apparatus is generally used in place of a conventional mercury lamp. For example, as a gas laser apparatus for exposure, a KrF excimer laser apparatus that outputs an ultraviolet laser beam having a wavelength of 248 nm and an ArF excimer laser apparatus that outputs an ultraviolet laser beam having a wavelength of 193 nm are used.

As next generation exposure technology, immersion exposure is practically used in which a gap between an exposure lens of an exposure apparatus and a wafer is filled with a liquid. In the immersion exposure, a refractive index between the exposure lens and the wafer changes to shorten an apparent wavelength of light from an exposure light source. When the immersion exposure is performed using the ArF excimer laser apparatus as the exposure light source, the wafer is irradiated with ultraviolet light having a wavelength of 134 nm in water. This technology is referred to as ArF immersion exposure (or ArF immersion lithography).

The KrF excimer laser apparatus and the ArF excimer laser apparatus have a large natural oscillation range of about 350 to 400 pm. Thus, if a projection lens is made of a material that transmits ultraviolet light such as KrF and ArF laser beams, chromatic aberration may occur, thereby reducing resolution. Then, a spectral line width of a laser beam output from the gas laser apparatus needs to be narrowed to the extent that the chromatic aberration can be ignored. For this purpose, a line narrowing module (LNM) having a line narrowing element (such as etalon or grating) is sometimes provided in a laser resonator of the gas laser apparatus to narrow the spectrum line width. A laser apparatus in which the spectrum line width is narrowed is hereinafter referred to as a line narrowing laser apparatus.

LIST OF DOCUMENTS

Patent Documents

Patent Document 1: Japanese Unexamined Patent Application Publication No. 06-203395
Patent Document 2: Japanese Unexamined Patent Application Publication No. 06-110554
Patent Document 3: US Published Patent Application No. 2018/159297
Patent Document 4: US Published Patent Application No. 2014/247384
Patent Document 5: U.S. Pat. No. 6,519,496

SUMMARY

A wavelength control method of a laser apparatus according to one aspect of the present disclosure includes sequentially obtaining target wavelength data of a pulse laser beam, sequentially saving the target wavelength data, sequentially measuring a wavelength of the pulse laser beam to obtain a measured wavelength, calculating a wavelength deviation using the measured wavelength and the target wavelength data at a time before a time when the measured wavelength is obtained, and feedback-controlling the wavelength of the pulse laser beam using the wavelength deviation.

An electronic device manufacturing method according to one aspect of the present disclosure includes sequentially obtaining target wavelength data of a pulse laser beam, sequentially saving the target wavelength data, sequentially measuring a wavelength of the pulse laser beam to obtain a measured wavelength, calculating a wavelength deviation using the measured wavelength and the target wavelength data at a time before a time when the measured wavelength is obtained, feedback-controlling the wavelength of the pulse laser beam using the wavelength deviation, outputting the pulse laser beam to an exposure apparatus, and exposing the pulse laser beam onto a photosensitive substrate within the exposure apparatus to manufacture an electronic device.

BRIEF DESCRIPTION OF THE DRAWINGS

With reference to the accompanying drawings, some embodiments of the present disclosure will be described below merely by way of example.

DESCRIPTION OF EMBODIMENTS

Figure 1:
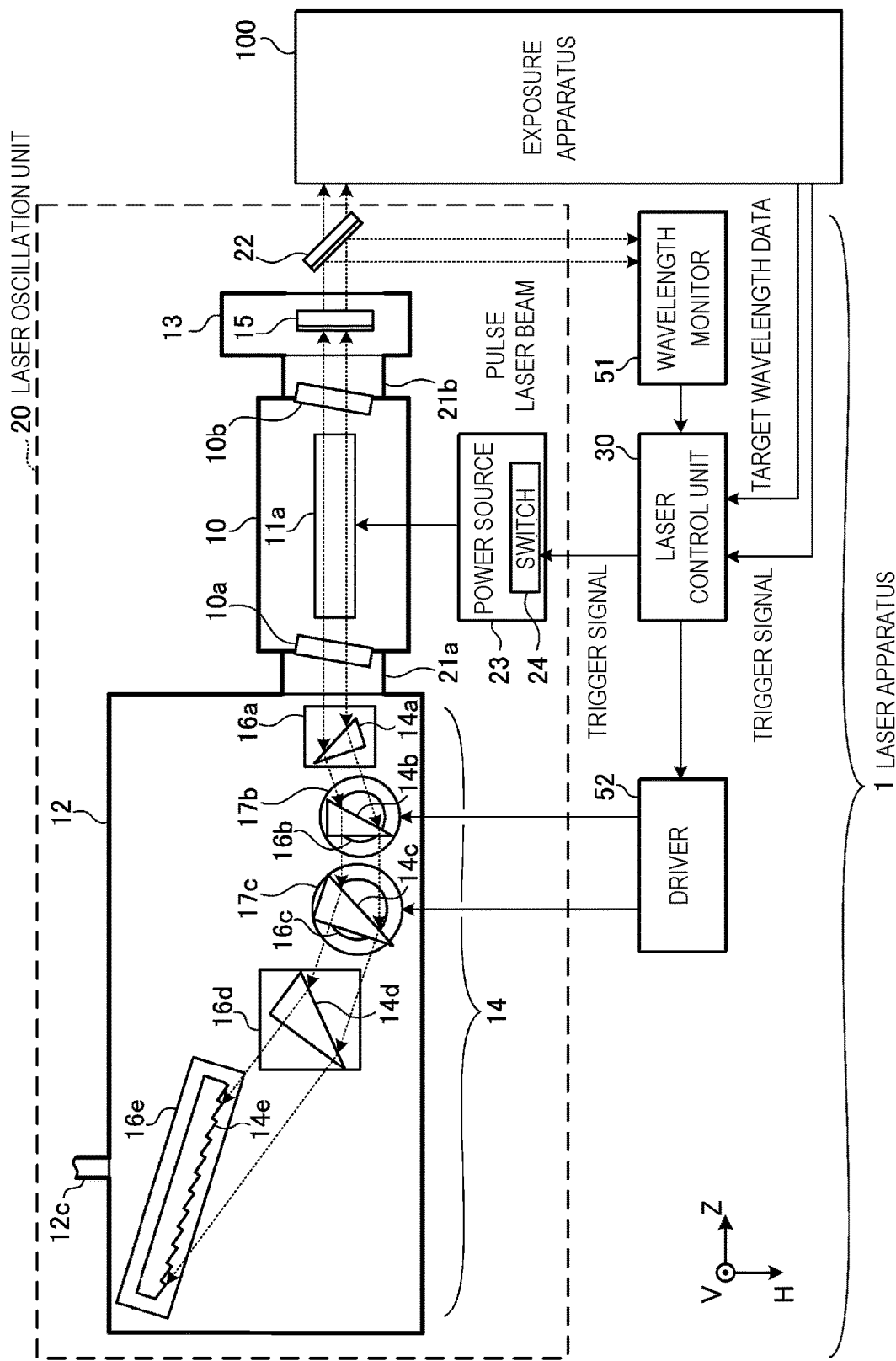
FIG. 1 diagrammatically shows a configuration of a laser apparatus 1 in a comparative example.

<Contents>
1. Comparative Example
    1.1 Configuration of laser apparatus
        1.1.1 Laser chamber
        1.1.2 Line narrowing module
        1.1.3 Output coupling mirror
    1.2 Operation of laser apparatus
    1.3 Configuration of laser control unit
    1.4 Operation of laser control unit
    1.5 Timing chart
    1.6 Problem
2. Wavelength control of laser apparatus to calculate wavelength deviation using past target wavelength data
    2.1 Configuration of laser control unit
    2.2 Operation of laser control unit
    2.3 Timing chart
    2.4 Effect
3. Wavelength control of laser apparatus to reduce predetermined frequency component contained in control signal
    3.1 Configuration of laser control unit
    3.2 Operation of laser control unit
    3.3 Effect
4. Others Now, with reference to the drawings, embodiments of the present disclosure will be described in detail. The embodiments described below illustrate some examples of the present disclosure, and do not limit contents of the present disclosure. Also, all configurations and operations described in the embodiments are not necessarily essential as configurations and operations of the present disclosure. The same components are denoted by the same reference numerals, and overlapping descriptions are omitted.

1. Comparative Example
    1.1 Configuration of Laser Apparatus

Figure 2:
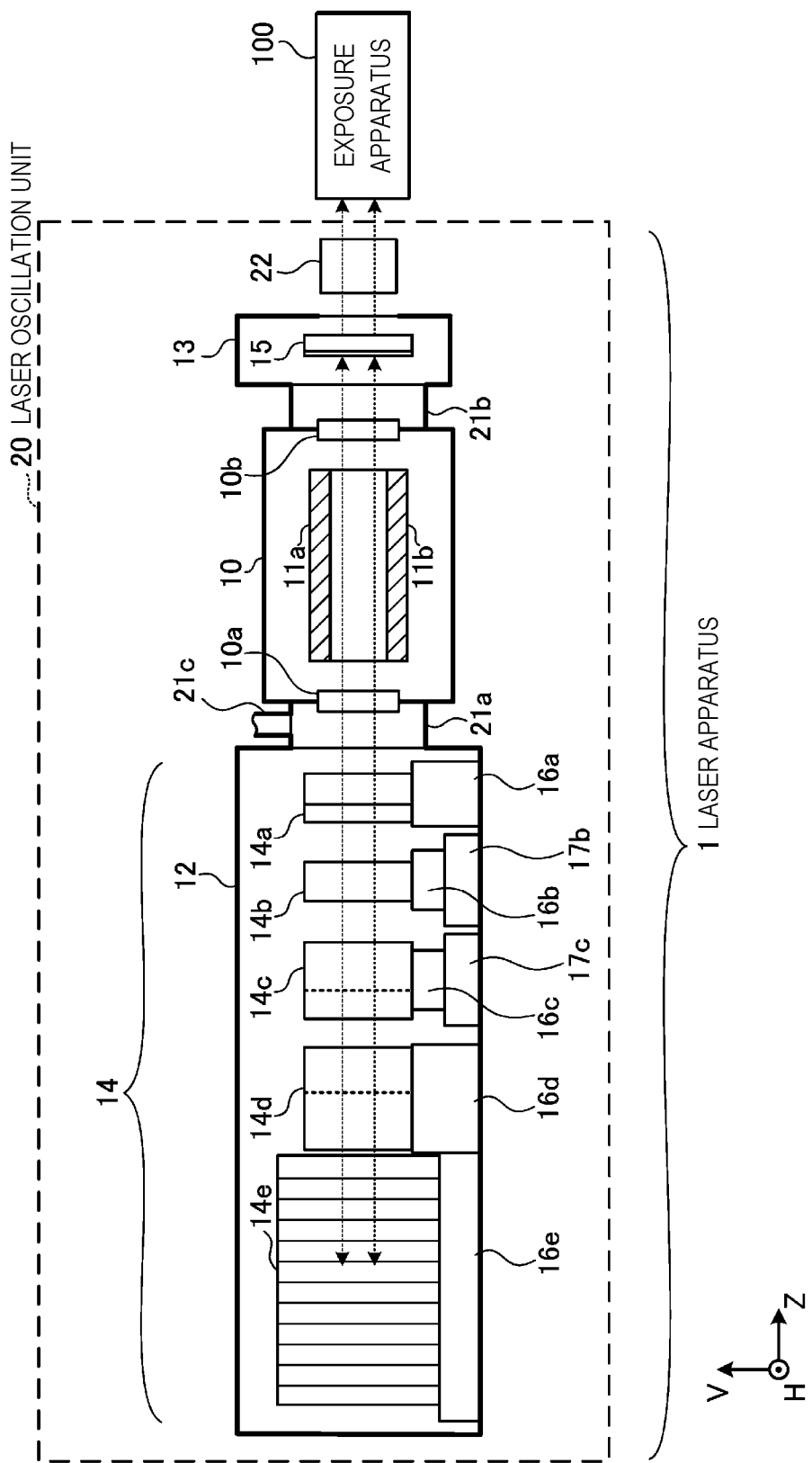
FIG. 2 diagrammatically shows a configuration of the laser apparatus 1 in the comparative example.

FIGS. 1 and 2 diagrammatically show a configuration of a laser apparatus 1 in a comparative example. The laser apparatus 1 in the comparative example includes a laser oscillation unit 20, a laser control unit 30, a wavelength monitor 51, and a driver 52. The laser oscillation unit 20 includes a laser chamber 10, a pair of discharge electrodes 11a and 11b, a line narrowing module 14, an output coupling mirror 15, a beam splitter 22, and a power source 23. The line narrowing module 14 and the output coupling mirror 15 constitute an optical resonator. The laser chamber 10 is arranged in an optical path of the optical resonator. The laser oscillation unit 20 is a master oscillator that outputs a pulse laser beam that enters an exposure apparatus 100. The power source 23 includes a switch 24.

FIG. 1 shows an internal configuration of the laser oscillation unit 20 when viewed in a direction substantially parallel to a discharge direction between the discharge electrodes 11a and 11b. FIG. 2 shows an internal configuration of the laser oscillation unit 20 when viewed in a direction substantially perpendicular to the discharge direction between the discharge electrodes 11a and 11b and substantially perpendicular to a traveling direction of a pulse laser beam output from the output coupling mirror 15 toward the beam splitter 22. The traveling direction of the pulse laser beam output from the output coupling mirror 15 toward the beam splitter 22 is a Z direction. The discharge direction between the discharge electrodes 11a and 11b is a V direction. A direction perpendicular to both the Z direction and the V direction is an H direction. A −V direction substantially matches a direction of gravitational force.

1.1.1 Laser Chamber

The laser chamber 10 contains a laser gas as a laser medium. The laser gas contains, for example, an argon gas or a krypton gas as a rare gas, a fluorine gas as a halogen gas, a neon gas as a buffer gas, and the like.

The discharge electrodes 11a and 11b are arranged in the laser chamber 10 to excite the laser medium by discharge. A longitudinal direction of the discharge electrode 11a and a longitudinal direction of the discharge electrode 11b substantially match the Z direction. The discharge electrode 11a is connected to the power source 23, and the discharge electrode 11b is connected to a ground potential.

The laser chamber 10 includes windows 10a and 10b at opposite ends. The windows 10a and 10b are arranged such that planes of incidence of light incident on the windows are substantially parallel to a HZ plane and that an incident angle of light is substantially a Brewster's angle.

1.1.2 Line Narrowing Module

The line narrowing module 14 includes at least one prism, a grating 14e, holders 16a to 16e, and a casing 12. At least one prism includes four prisms 14a to 14d.

The four prisms 14a to 14d are made of calcium fluoride crystals. The grating 14e is an echelle grating in which a surface thereof includes a material with high reflectance and have many grooves formed at predetermined intervals.

The casing 12 houses the prisms 14a to 14d and the grating 14e. The prism 14a is supported by the holder 16a, the prism 14b is supported by the holder 16b, the prism 14c is supported by the holder 16c, the prism 14d is supported by the holder 16d, and the grating 14e is supported by the holder 16e.

The holder 16b supporting the prism 14b is supported by a rotary stage 17b. The holder 16c supporting the prism 14c is supported by a rotary stage 17c. Rotation axes of the rotary stage 17b and the rotary stage 17c substantially match the V direction. The rotary stage 17b includes a piezoelectric element as a wavelength actuator 25 (see FIG. 3). The rotary stage 17c includes an automatic micrometer as a wavelength actuator 25. These wavelength actuators 25 are connected to the driver 52.

The casing 12 is connected to the laser chamber 10 via an optical path tube 21a. The optical path tube 21a communicates with the casing 12. An inert gas inlet 12c (see FIG. 1) is connected to the casing 12 at a position away from the optical path tube 21a. An inert gas outlet 21c (see FIG. 2) is connected to the optical path tube 21a. An inert gas is introduced from the inert gas inlet 12c into the casing 12 and the optical path tube 21a and discharged from the inert gas outlet 21c. As such, the casing 12 and the optical path tube 21a are purged with the inert gas.

1.1.3 Output Coupling Mirror

The output coupling mirror 15 is housed in a casing 13. One surface of the output coupling mirror 15 is coated with a partially reflective film. The other surface of the output coupling mirror 15 is coated with an anti-reflective film.

The casing 13 is connected to the laser chamber 10 via an optical path tube 21b. The optical path tube 21b communicates with the casing 13. An inert gas inlet and an inert gas outlet (not shown) are connected to the optical path tube 21b or the casing 13. The optical path tube 21b and the casing 13 are purged with the inert gas.

The beam splitter 22 is arranged in an optical path of the pulse laser beam output from the output coupling mirror 15. One surface of the beam splitter 22 is coated with a partially reflective film. The other surface of the beam splitter 22 is coated with an anti-reflective film.

The wavelength monitor 51 is arranged in an optical path of the pulse laser beam reflected by the beam splitter 22. The wavelength monitor 51 includes a spectrometer such as etalon (not shown) and an image sensor (not shown).

1.2 Operation of Laser Apparatus

The laser control unit 30 sequentially obtains a trigger signal output at regular time intervals from the exposure apparatus 100. The laser control unit 30 outputs the trigger signal to the switch 24 included in the power source 23. When the trigger signal is input to the switch 24, the power source 23 applies a pulsed high voltage between the discharge electrodes 11a and 11b.

When the pulsed high voltage is applied between the discharge electrodes 11a and 11b, discharge occurs between the discharge electrodes 11a and 11b. By energy of the discharge, the laser medium in the laser chamber 10 is excited to a high energy level. When the excited laser medium then shifts to a low energy level, the excited laser medium emits light having a wavelength corresponding to a difference between the energy levels.

The light generated in the laser chamber 10 is emitted outside the laser chamber 10 through the windows 10a and 10b. The light emitted through the window 10a of the laser chamber 10 is refracted in the HZ plane by the prisms 14a to 14d and thus increased in width in the H direction, and enters the grating 14e.

The light entering the grating 14e from the prisms 14a to 14d is reflected by the plurality of grooves in the grating 14e and diffracted in a direction corresponding to the wavelength of the light. Thus, the light reflected by the grooves in the grating 14e is dispersed in the HZ plane. The grating 14e is configured in a Littrow arrangement such that an incident angle of the light entering the grating 14e from the prisms 14a to 14d matches a diffraction angle of diffracted light having a desired wavelength.

The prisms 14a to 14d reduce the width of the diffracted light from the grating 14e in the H direction, and return the light through the window 10a into the laser chamber 10.

The output coupling mirror 15 transmits and outputs one part of the light emitted through the window 10b of the laser chamber 10, and reflects and returns the other part into the laser chamber 10.

As such, the light emitted from the laser chamber 10 reciprocates between the line narrowing module 14 and the output coupling mirror 15 and is amplified every time it passes through a discharge space between the discharge electrodes 11a and 11b. The light is subjected to line narrowing every time it is returned from the line narrowing module 14. The light thus amplified is output as a pulse laser beam from the output coupling mirror 15. This pulse laser beam has a wavelength of a vacuum ultraviolet region.

The beam splitter 22 transmits one part of the pulse laser beam output from the output coupling mirror 15 with high transmittance and reflects the other part thereof. The pulse laser beam having passed through the beam splitter 22 enters the exposure apparatus 100. The pulse laser beam reflected by the beam splitter 22 enters the spectrometer (not shown) included in the wavelength monitor 51. The spectrometer forms an interference pattern of the pulse laser beam on a light receiving surface of the image sensor (not shown) included in the wavelength monitor 51. The image sensor generates image data of the interference pattern. The wavelength monitor 51 transmits measurement data such as the image data to the laser control unit 30.

The laser control unit 30 obtains target wavelength data output at regular time intervals from the exposure apparatus 100. The laser control unit 30 also receives measurement data from the wavelength monitor 51, and calculates a wavelength of the pulse laser beam using the measurement data to obtain a measured wavelength. The laser control unit 30 outputs a control signal to the driver 52 based on the target wavelength data and the measured wavelength. The driver 52 applies a drive voltage to the wavelength actuators 25 included in the rotary stages 17b and 17c according to the control signal.

The wavelength actuators 25 included in the rotary stages 17b and 17c rotate the prisms 14b and 14c, respectively, clockwise or counterclockwise in FIG. 1 according to the drive voltage from the driver 52. The prisms 14b and 14c are rotated to adjust orientations of the prisms 14b and 14c, thereby adjusting an incident angle of light on the grating 14e and adjusting an oscillation wavelength.

The orientation of the prism 14c is adjusted to coarsely adjust the wavelength, and the orientation of the prism 14b is adjusted to finely adjust the wavelength. The orientation of the prism 14b is adjusted, for example, in a burst period in which the pulse laser beam is output at a fixed repetition frequency. The orientation of the prism 14c is adjusted, for example, in a pause period in which the output of the pulse laser beam at the fixed repetition frequency is paused. The burst period corresponds to, for example, a period in which the exposure apparatus 100 performs exposure of one exposure area of a semiconductor wafer. The pause period corresponds to, for example, a period in which an image forming position of a reticle pattern is moved from one exposure area to another exposure area in the exposure apparatus 100 or a period in which a semiconductor wafer is replaced.

1.3 Configuration of Laser Control Unit

Figure 3:
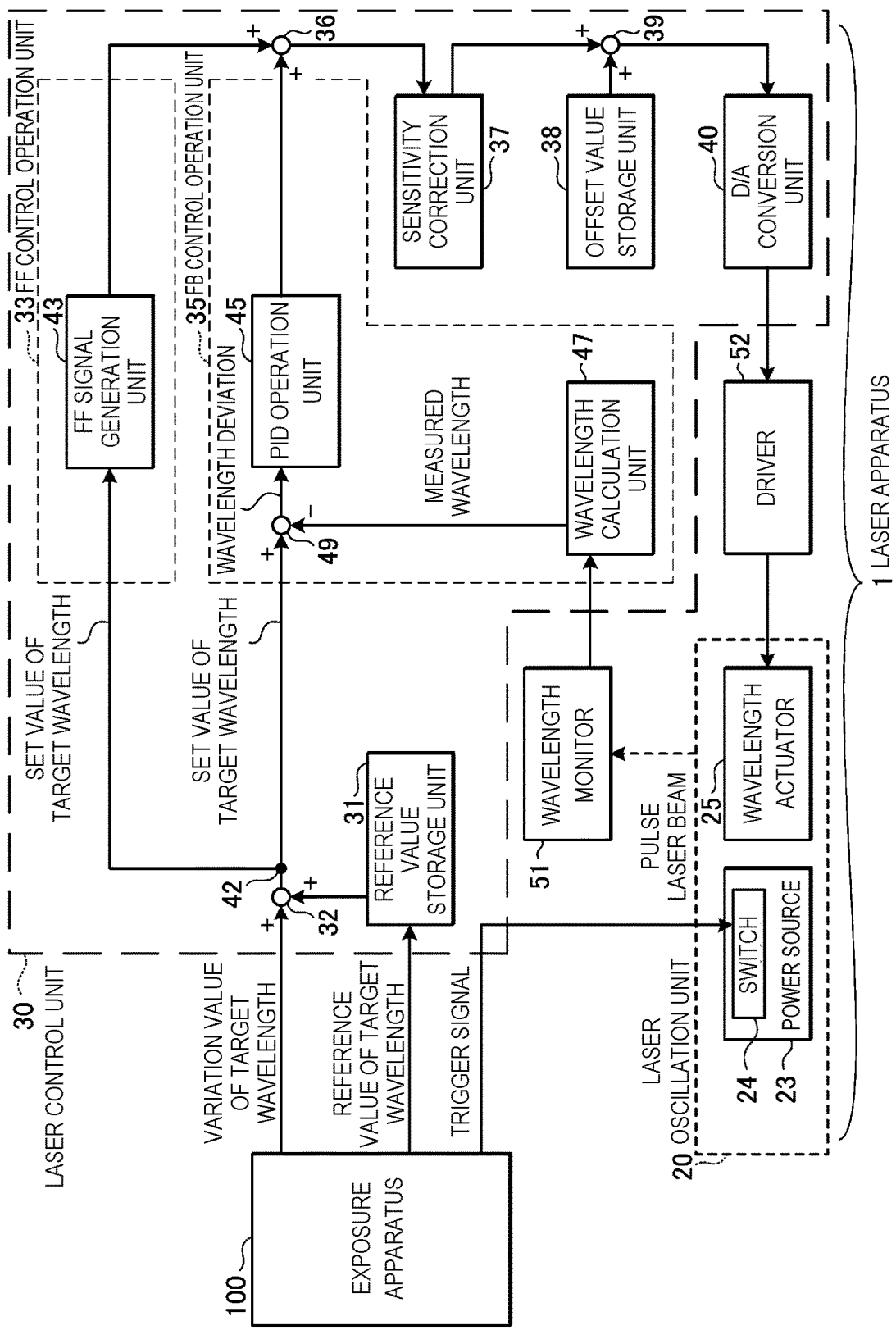
FIG. 3 is a block diagram of a laser control unit 30 in the comparative example.

FIG. 3 is a block diagram of the laser control unit 30 in the comparative example. The laser control unit 30 includes a reference value storage unit 31, a feedforward (FF) control operation unit 33, a feedback (FB) control operation unit 35, a sensitivity correction unit 37, an offset value storage unit 38, and a digital/analog (D/A) conversion unit 40. The FF control operation unit 33 includes an FF signal generation unit 43. The FB control operation unit 35 includes a proportional-integral-differential (PID) operation unit 45, and a wavelength calculation unit 47. The components of the laser control unit 30 may be formed by hardware or software.

The laser control unit 30 obtains a trigger signal, a reference value of a target wavelength, and a variation value of the target wavelength from the exposure apparatus 100. The laser control unit 30 outputs the trigger signal to the switch 24 included in the power source 23 of the laser oscillation unit 20. The reference value and the variation value are examples of target wavelength data. The laser control unit 30 separately obtains the reference value and the variation value from the exposure apparatus 100.

The reference value of the target wavelength is, for example, an initial value. Alternatively, the reference value of the target wavelength may be a value sequentially updated with variation of the target wavelength. When obtaining the reference value from the exposure apparatus 100, the laser control unit 30 stores the reference value in the reference value storage unit 31.

The variation value of the target wavelength indicates an amount of displacement with respect to the reference value, and is a positive or negative value output at regular time intervals from the exposure apparatus 100.

When the laser control unit 30 obtains the variation value from the exposure apparatus 100, an addition unit 32 adds the variation value to the reference value to calculate a set value of the target wavelength. The set value of the target wavelength is an example of target wavelength data. The laser control unit 30 inputs the set value of the target wavelength via a branch portion 42 to the FF control operation unit 33 and the FB control operation unit 35.

The laser control unit 30 may obtain the set value of the target wavelength from the exposure apparatus 100 instead of obtaining the reference value and the variation value from the exposure apparatus 100.

When the set value of the target wavelength is input to the FF control operation unit 33, the FF signal generation unit 43 generates an FF signal using the set value of the target wavelength. The FF signal includes, for example, a control value proportional to the set value of the target wavelength.

As described above, the laser control unit 30 receives measurement data from the wavelength monitor 51. When the laser control unit 30 receives the measurement data, the wavelength calculation unit 47 in the FB control operation unit 35 calculates a wavelength of a pulse laser beam using the measurement data to obtain a measured wavelength. The FB control operation unit 35 multiplies the value of the measured wavelength by −1, and the resulting value is added to the set value of the target wavelength by an addition unit 49. Thus, the FB control operation unit 35 calculates a difference between the value of the measured wavelength and the set value of the target wavelength as a wavelength deviation. The PID operation unit 45 in the FB control operation unit 35 performs PID operation using the wavelength deviation to generate an FB signal. The FB signal contains a control value such as to reduce the wavelength deviation. For example, the FB signal includes a control value such that the wavelength deviation is close to 0.

The FF signal and the FB signal are input via an addition unit 36 to the sensitivity correction unit 37.

The sensitivity correction unit 37 corrects sensitivity of the FF signal and the FB signal according to a characteristic of the wavelength actuator 25 included in the rotary stage 17b (see FIGS. 1 and 2) in the laser oscillation unit 20.

The offset value storage unit 38 stores an offset value set such that the wavelength actuator 25 operates around a center of a control range of the wavelength actuator 25. For example, when the wavelength actuator 25 is controlled with a drive voltage in a range of 0 V to 5 V, the offset value is set to 2.5 V. An addition unit 39 adds the offset value to the signal output from the sensitivity correction unit 37, and then the signal is input to the D/A conversion unit 40.

The D/A conversion unit 40 converts a digital control signal to an analog control signal and outputs the analog control signal to the driver 52. The driver 52 applies a drive voltage to the wavelength actuator 25 included in the rotary stage 17b according to the analog control signal. From the above, FF control based on the FF signal and FB control based on the FB signal are performed.

1.4 Operation of Laser Control Unit

Figure 4:
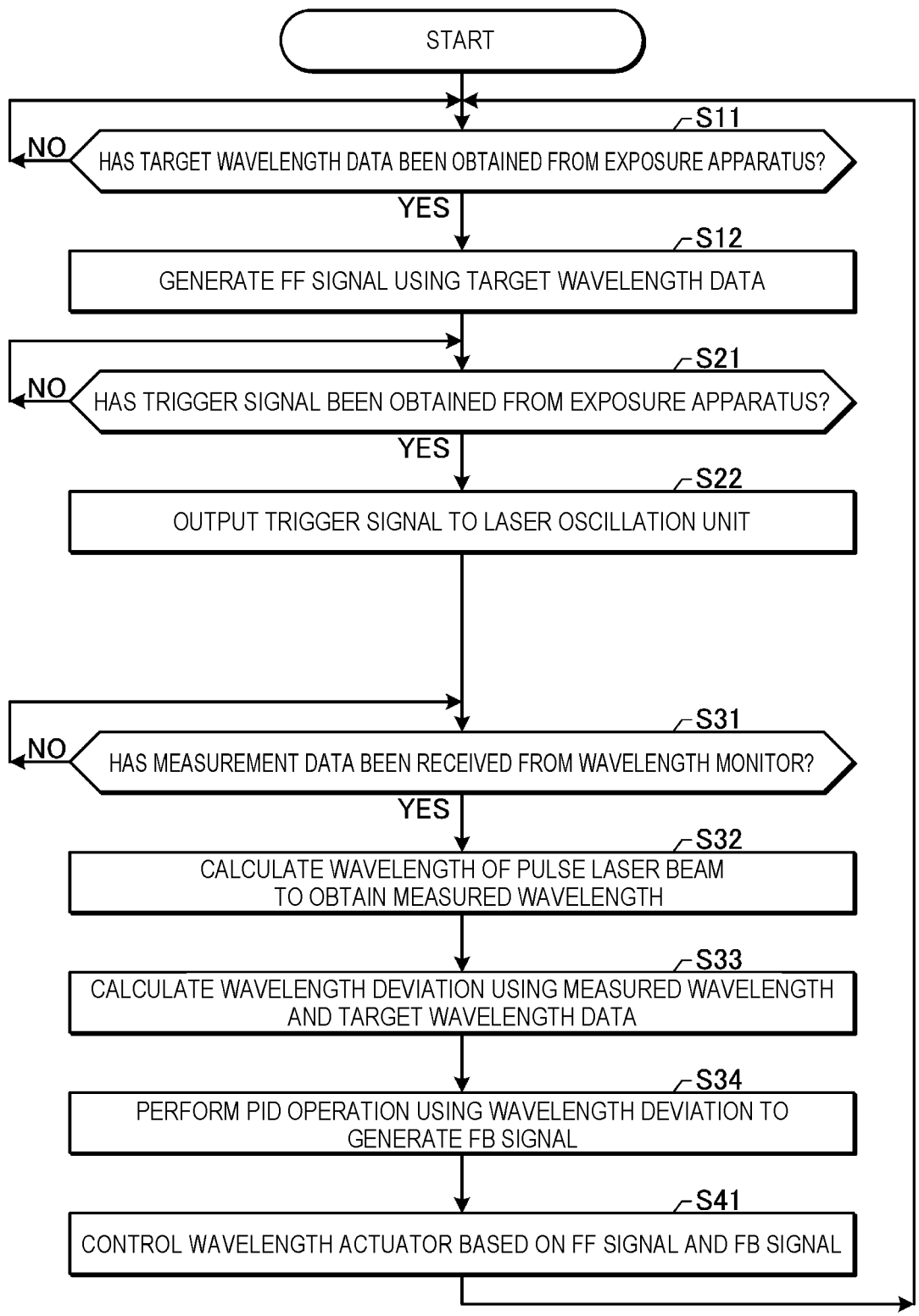
FIG. 4 is a flowchart of the laser control unit 30 in the comparative example.

FIG. 4 is a flowchart of the laser control unit 30 in the comparative example. The laser control unit 30 performs processes (1) to (4) below.

(1) FF signal generation process at timing when target wavelength data is obtained (S11, S12)
(2) Process at timing when trigger signal is obtained (S21, S22)
(3) FB signal generation process at timing when measurement data is received (S31 to S34)
(4) Process to control wavelength actuator (S41)

(1) FF Signal Generation Process at Timing when Target Wavelength Data is Obtained (S11, S12)

In S11, the laser control unit 30 determines whether or not it has obtained target wavelength data from the exposure apparatus 100. When the target wavelength data to be obtained from the exposure apparatus 100 by the laser control unit 30 contains a reference value of a target wavelength and a variation value, the laser control unit 30 determines whether or not it has obtained both the reference value and the variation value. When obtaining the target wavelength data (YES in S11), the laser control unit 30 goes to S12. When not obtaining the target wavelength data (NO in S11), the laser control unit 30 repeats the process in S11 until obtaining the target wavelength data.

In S12, the laser control unit 30 uses the FF control operation unit 33 to generate an FF signal using the target wavelength data. The FF signal is used in S41 described later. After S12, the laser control unit 30 goes to S21.

(2) Process at Timing when Trigger Signal is Obtained (S21, S22)

In S21, the laser control unit 30 determines whether or not it has obtained a trigger signal from the exposure apparatus 100. When obtaining the trigger signal (YES in S21), the laser control unit 30 goes to S22. When not obtaining the trigger signal (NO in S21), the laser control unit 30 repeats the process in S21 until obtaining the trigger signal.

In S22, the laser control unit 30 outputs the trigger signal to the laser oscillation unit 20. After S22, the laser control unit 30 goes to S31.

(3) FB Signal Generation Process at Timing when Measurement Data is Received (S31 to S34)

In S31, the laser control unit 30 determines whether or not it has received measurement data from the wavelength monitor 51. When receiving the measurement data (YES in S31), the laser control unit 30 goes to S32. When not obtaining the measurement data (NO in S31), the laser control unit 30 repeats the process in S31 until receiving the measurement data.

In S32, the laser control unit 30 uses the FB control operation unit 35 to calculate a wavelength of a pulse laser beam using the measurement data to obtain a measured wavelength.

Then, in S33, the laser control unit 30 uses the FB control operation unit 35 to calculate a wavelength deviation using the measured wavelength and the target wavelength data. The wavelength deviation is calculated using the current target wavelength data.

Then, in S34, the laser control unit 30 uses the FB control operation unit 35 to perform PID operation using the wavelength deviation to generate an FB signal. After S34, the laser control unit 30 goes to S41. The FB signal is used in S41.

(4) Process to Control Wavelength Actuator (S41)

In S41, the laser control unit 30 outputs a control signal based on the FF signal and the FB signal to control the wavelength actuator 25. After S41, the laser control unit 30 returns to S11.

1.5 Timing Chart

Figure 5:
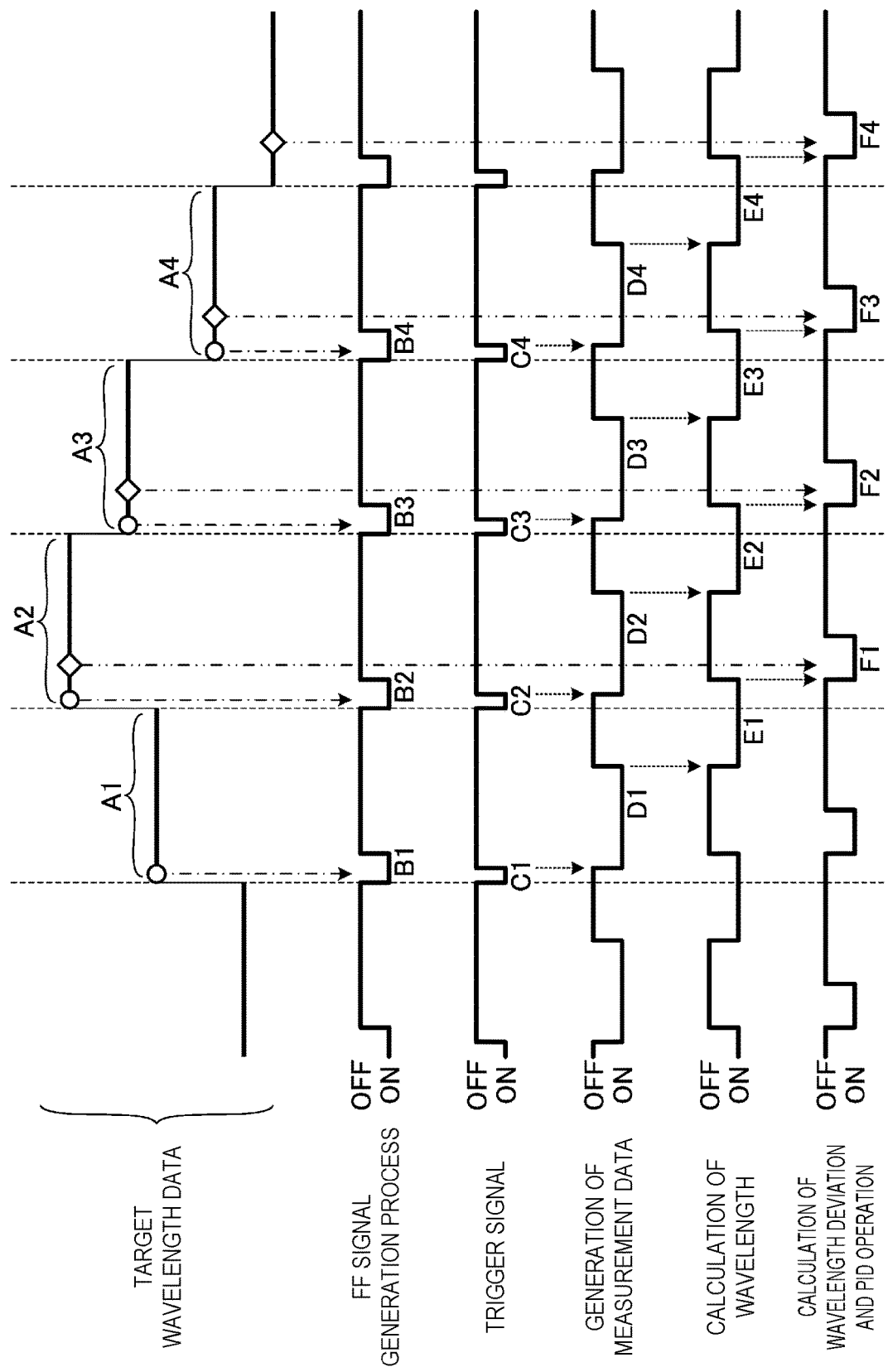
FIG. 5 is a timing chart of wavelength control in the comparative example.

FIG. 5 is a timing chart of wavelength control in the comparative example. FIG. 5 shows changes of some processes and signals on a common time axis. Time progresses from left to right in FIG. 5.

The laser control unit 30 sequentially obtains target wavelength data output at regular time intervals from the exposure apparatus 100. Thus, the target wavelength data is updated at regular time intervals. When the target wavelength data contains a reference value of a target wavelength and a variation value, the target wavelength data is updated every time the laser control unit 30 obtains a variation value. After the target wavelength data is updated and before the target wavelength data is next updated, the target wavelength data is maintained at a fixed value. For example, in each of periods A1, A2, A3, and A4, the target wavelength data is maintained at a fixed value.

The FF control operation unit 33 performs the FF signal generation process at timing when the target wavelength data is obtained. For example, generation of an FF signal is started synchronously with a start time of each of the periods A1, A2, A3, and A4. The FF control operation unit 33 generates an FF signal in each of periods B1, B2, B3, and B4.

The laser control unit 30 sequentially obtains a trigger signal output at regular time intervals from the exposure apparatus 100. The laser control unit 30 outputs the trigger signal to the laser oscillation unit 20. At timing when each trigger pulse contained in the trigger signal is obtained, the laser oscillation unit 20 outputs each light pulse of the pulse laser beam.

The wavelength monitor 51 receives each light pulse of the pulse laser beam output at timing when each trigger pulse contained in the trigger signal is obtained. When receiving the pulse laser beam, the wavelength monitor 51 generates measurement data such as image data of an interference pattern. For example, the wavelength monitor 51 starts generation of the measurement data synchronously with an end time of each of periods C1, C2, C3, and C4 corresponding to each trigger pulse contained in the trigger signal. The wavelength monitor 51 generates measurement data in each of periods D1, D2, D3, and D4, and sequentially outputs the measurement data to the laser control unit 30.

The laser control unit 30 uses the FB control operation unit 35 to calculate a wavelength of the pulse laser beam at timing when the measurement data is received. For example, the FB control operation unit 35 starts calculation of the wavelength synchronously with an end time of each of the periods D1, D2, D3, and D4 in which the wavelength monitor 51 generates the measurement data. The FB control operation unit 35 calculates the wavelength of the pulse laser beam in each of periods E1, E2, E3, and E4 to sequentially obtain a measured wavelength.

The FB control operation unit 35 calculates a wavelength deviation using the measured wavelength and the target wavelength data at timing when the measured wavelength is obtained. Further, the FB control operation unit 35 performs PID operation using the wavelength deviation. For example, the FB control operation unit 35 starts calculation of the wavelength deviation and the PID operation synchronously with an end time of each of the periods E1, E2, E3, and E4 in which the FB control operation unit 35 calculates the wavelength of the pulse laser beam to obtain the measured wavelength. The FB control operation unit 35 performs the calculation of the wavelength deviation and the PID operation in each of periods F1, F2, F3, and F4 to sequentially generate an FB signal.

1.6 Problem

As shown in FIG. 5, the calculation of the wavelength deviation and the PID operation in the period F1 are performed using the target wavelength data in the period A2. Similarly, the calculation of the wavelength deviation and the PID operation in the periods F2, F3 are performed using the target wavelength data in the periods A3, A4, respectively. Specifically, the calculation of the wavelength deviation and the PID operation are performed using the current target wavelength data.

However, the calculation of the wavelength deviation and the PID operation in the period F1 are performed using the measured wavelength of the pulse laser beam wavelength-controlled with the target wavelength data in the period A1. Similarly, the calculation of the wavelength deviation and the PID operation in the periods F2 and F3 are performed using the measured wavelength of the pulse laser beam wavelength-controlled with the target wavelength data in the periods A2 and A3. Specifically, the calculation of the wavelength deviation and the PID operation are performed using the current target wavelength data and the measured wavelength of the pulse laser beam output in the past.

There may be a case that the current target wavelength data is different from the past target wavelength data. If the calculation of the wavelength deviation and the PID operation are performed using the current target wavelength data and the measured wavelength of the pulse laser beam wavelength-controlled with the past target wavelength data, incorrect compensation may be made. This may reduce stability of the wavelength.

Embodiments described below disclose a laser apparatus and a wavelength control method capable of suppressing reduction in stability of a wavelength even if target wavelength data when calculation of a wavelength deviation and PID operation are performed is different from target wavelength data when a pulse laser beam is output.

Figure 6:
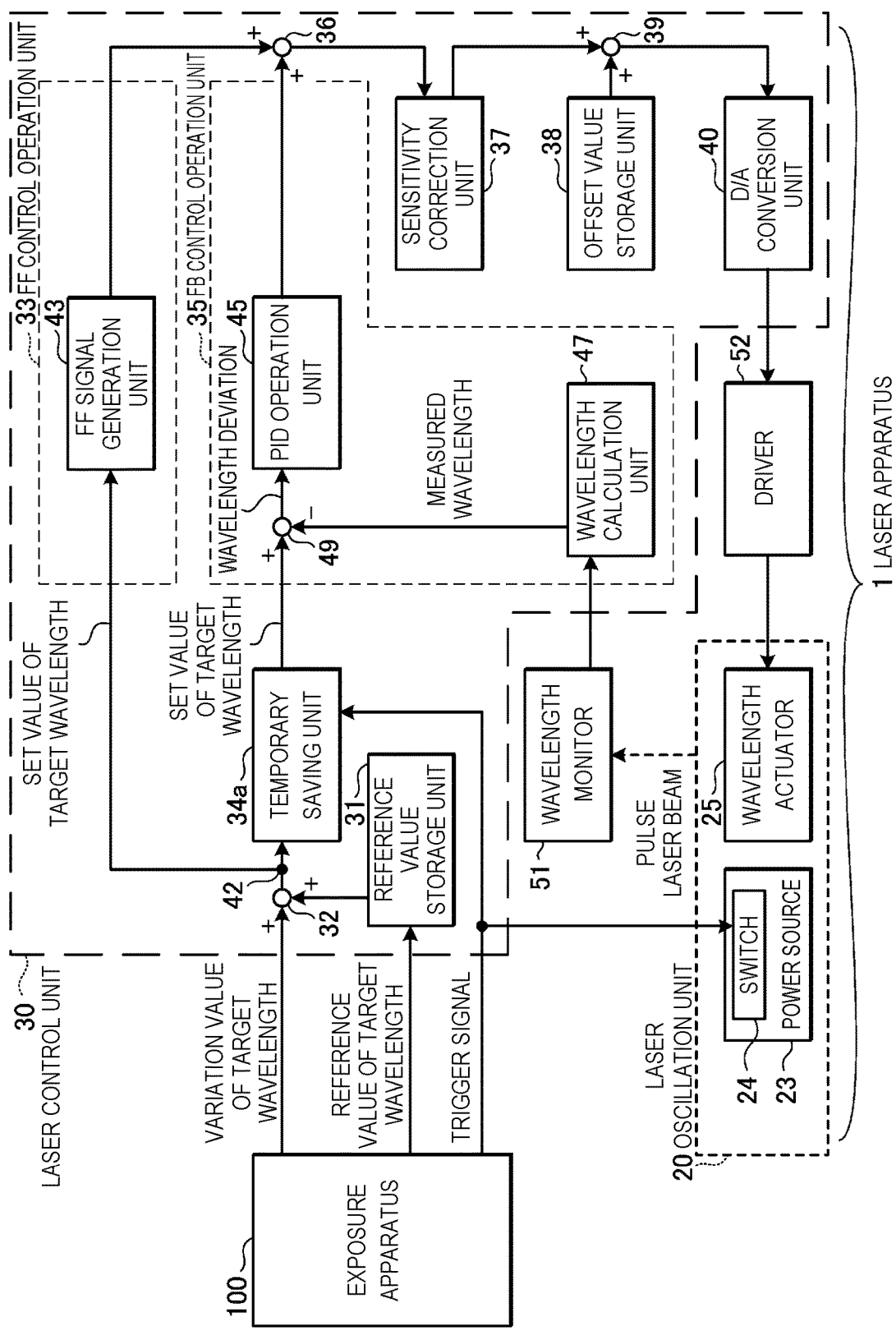
FIG. 6 is a block diagram of a laser control unit 30 in a first embodiment of the present disclosure.

2. Wavelength Control of Laser Apparatus to Calculate Wavelength Deviation Using Past Target Wavelength Data 2.1 Configuration of Laser Control Unit FIG. 6 is a block diagram of a laser control unit 30 in a first embodiment of the present disclosure. In the first embodiment, the laser control unit 30 includes a temporary saving unit 34a. In the first embodiment, configurations and operations of the laser apparatus 1 other than the laser control unit 30 are the same as those in the comparative example described with reference to FIGS. 1 and 2.

The temporary saving unit 34a is arranged between an FB control operation unit 35 and a branch portion 42 that inputs a set value of a target wavelength to an FF control operation unit 33 and the FB control operation unit 35. The temporary saving unit 34a temporarily saves the set value of the target wavelength. A trigger signal obtained from an exposure apparatus 100 is further input to the temporary saving unit 34a. The temporary saving unit 34a sequentially saves the set value of the target wavelength at a time when the trigger signal is input.

The FB control operation unit 35 calculates a wavelength deviation using the set value of the target wavelength saved in the temporary saving unit 34a, and performs PID operation to generate an FB signal. The set value of the target wavelength sequentially saved in the temporary saving unit 34a may be sequentially erased from the temporary saving unit 34a after input to the FB control operation unit 35.

The FF control operation unit 33 generates an FF signal using a set value of a current target wavelength not using the set value of the target wavelength saved in the temporary saving unit 34a.

For other points, the configuration of the laser control unit 30 in the first embodiment is the same as that of the comparative example described with reference to FIG. 3.

2.2 Operation of Laser Control Unit

Figure 7:
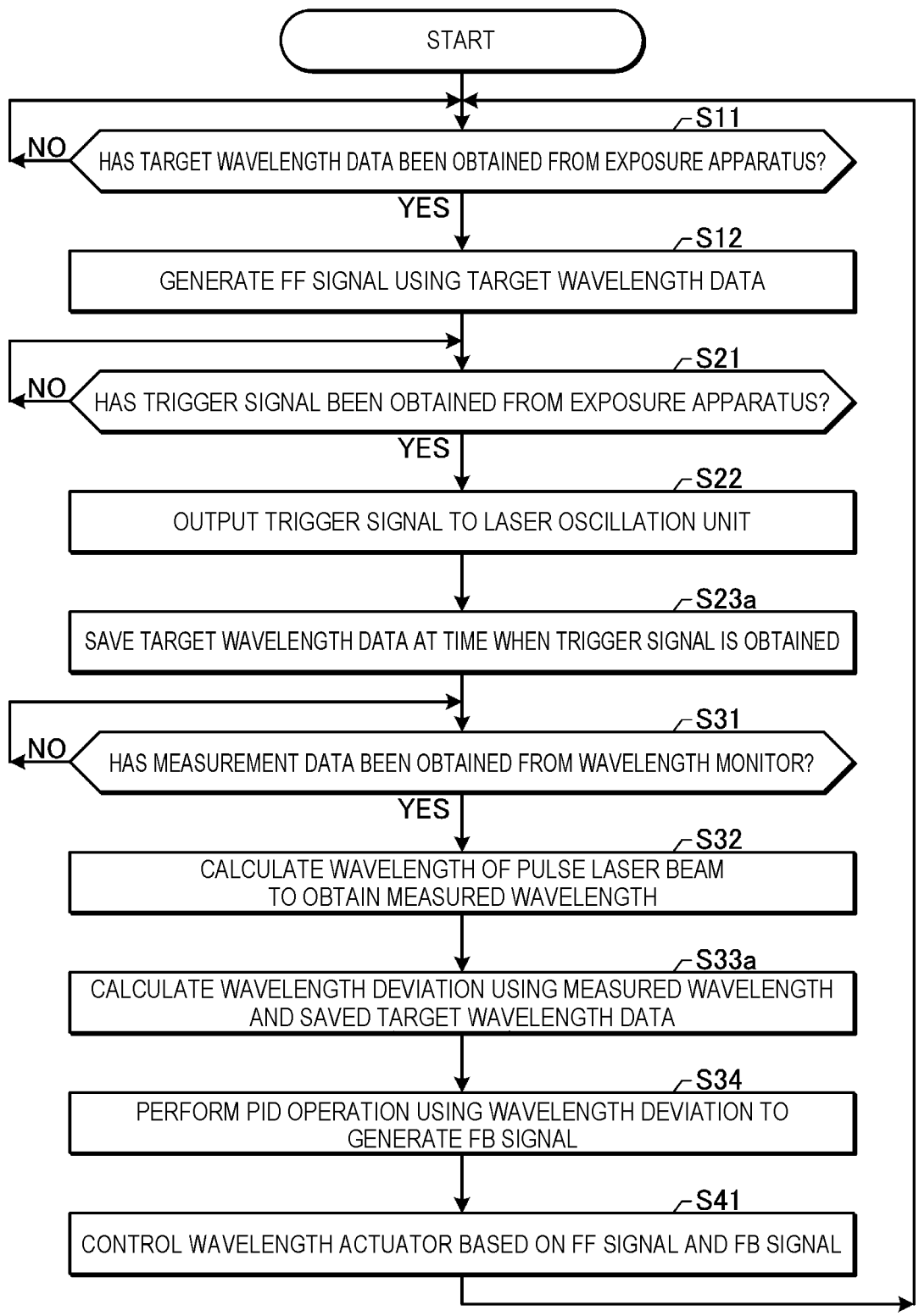
FIG. 7 is a flowchart of the laser control unit 30 in the first embodiment.

FIG. 7 is a flowchart of the laser control unit 30 in the first embodiment. The laser control unit 30 in the first embodiment is different from that in the comparative example in saving target wavelength data at timing when a trigger signal is obtained (S23a) and using the saved target wavelength data to calculate a wavelength deviation (S33a).

Steps S11 to S22 in FIG. 7 are the same as those in the comparative example described with reference to FIG. 4. After S22, in S23a, the laser control unit 30 saves, in the temporary saving unit 34a, target wavelength data at a time when the trigger signal is obtained. After S23a, the laser control unit 30 goes to S31.

Processes in S31 and S32 are the same as those in the comparative example described with reference to FIG. 4. After S32, in S33a, the laser control unit 30 calculates a wavelength deviation using a measured wavelength and the target wavelength data saved in the temporary saving unit 34a. The target wavelength data used to calculate the wavelength deviation is target wavelength data at a time before a time when the laser control unit 30 obtains the measured wavelength. Processes in S34 and S41 after S33a are the same as those in the comparative example described with reference to FIG. 4.

2.3 Timing Chart

Figure 8:
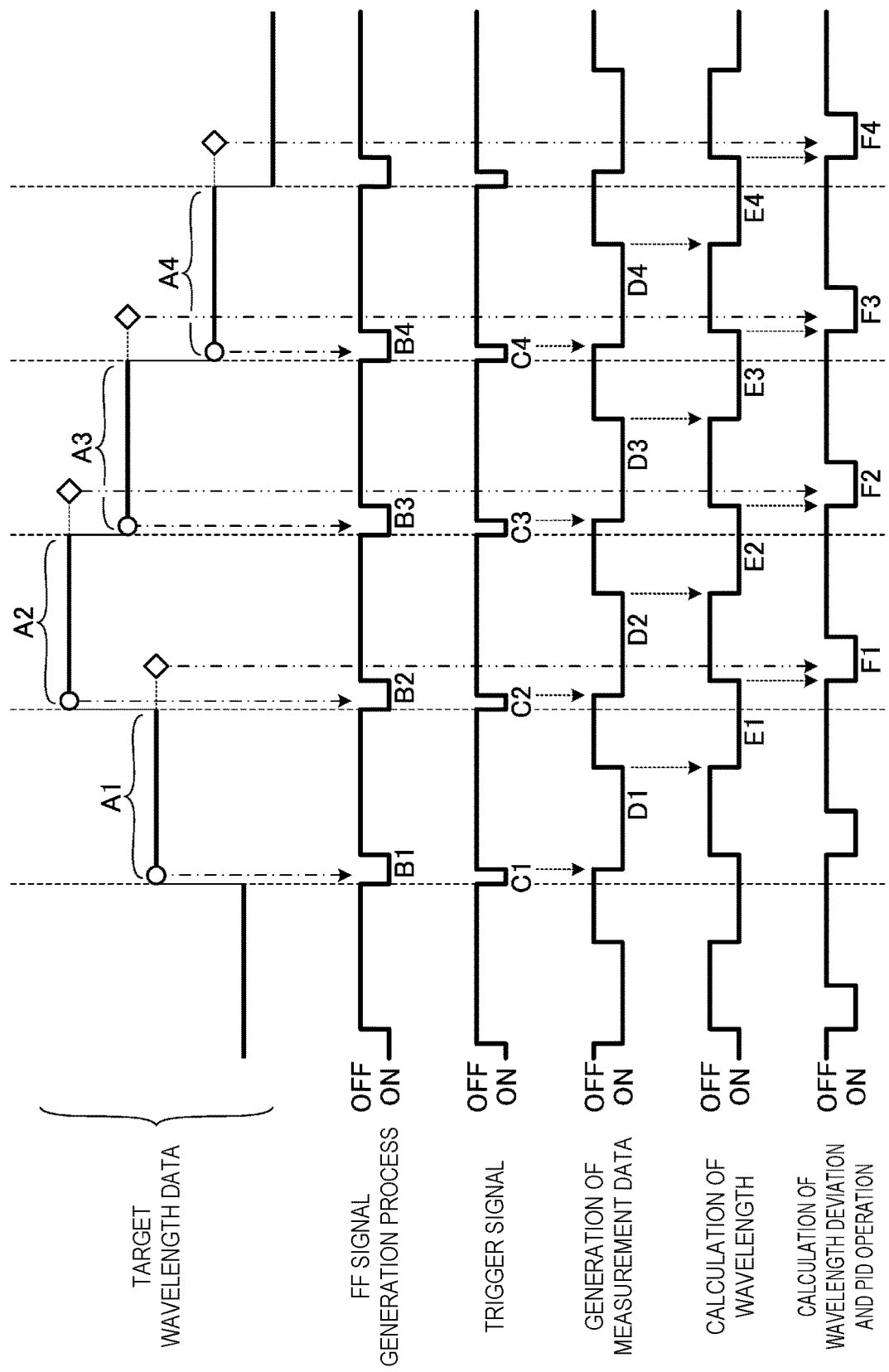
FIG. 8 is a timing chart of wavelength control in the first embodiment.

FIG. 8 is a timing chart of wavelength control in the first embodiment. In the first embodiment, at timing when each trigger pulse contained in the trigger signal is obtained, the laser control unit 30 sequentially saves target wavelength data at a time when each trigger pulse is obtained. For example, when obtaining a trigger pulse in a period C1, the laser control unit 30 saves target wavelength data in a period A1 corresponding to the time when the trigger pulse is obtained in the period C1. Similarly, when obtaining trigger pulses in periods C2 and C3, the laser control unit 30 saves target wavelength data in periods A2 and A3, respectively.

The calculation of the wavelength deviation and the PID operation in a period F1 are performed using a measured wavelength obtained by measuring a wavelength of a light pulse output at timing when the trigger pulse is obtained in the period C1. The measured wavelength is obtained at an end time of a period E1 by the FB control operation unit 35. Specifically, the calculation of the wavelength deviation and the PID operation in the period F1 are performed using a measured wavelength obtained after a time when the laser control unit 30 obtains the trigger pulse in the period C2 after the period C1. For the calculation of the wavelength deviation and the PID operation in the period F1, the trigger pulse in the period C1 corresponds to a first trigger pulse in the present disclosure, and the trigger pulse in the period C2 corresponds to a second trigger pulse in the present disclosure. Similarly, the calculation of the wavelength deviation and the PID operation in periods F2 and F3 are performed using measured wavelengths obtained after times when the laser control unit 30 obtains trigger pulses in periods C3 and C4, respectively.

The calculation of the wavelength deviation and the PID operation in the period F1 are performed using the target wavelength data in the period A1 not using the target wavelength data in the period A2. Specifically, the calculation of the wavelength deviation and the PID operation in the period F1 are performed using the target wavelength data before a time when the laser control unit 30 obtains the trigger pulse in the period C2. In particular, the calculation of the wavelength deviation and the PID operation in the period F1 are performed using the target wavelength data at a time when the laser control unit 30 obtains the trigger pulse in the period C1. Similarly, the calculation of the wavelength deviation and the PID operation in the periods F2 and F3 are performed using the target wavelength data before times when the laser control unit 30 obtains the trigger pulses in the periods C3 and C4, respectively. The calculation of the wavelength deviation and the PID operation in the periods F2 and F3 are performed using the target wavelength data at times when the laser control unit 30 obtains the trigger pulses in the periods C2 and C3, respectively.

The FF control operation unit 33 generates the FF signal using the current target wavelength data at timing when the target wavelength data is obtained. Thus, a first time difference between the time when the laser control unit 30 obtains the target wavelength data and the time when the laser control unit 30 inputs the target wavelength data to the FF control operation unit 33 is relatively short. The time when the laser control unit 30 obtains the target wavelength data is, for example, a start time of the period A1, and corresponds to a first time in the present disclosure. The time when the laser control unit 30 inputs the target wavelength data to the FF control operation unit 33 is, for example, any time between start and end of the period B1, and corresponds to a second time in the present disclosure.

The FB control operation unit 35 generates the FB signal using the target wavelength data at a time before a time when the measured wavelength is obtained, at timing when the measured wavelength is obtained. Thus, a second time difference between the time when the laser control unit 30 obtains the target wavelength data and the time when the laser control unit 30 inputs the target wavelength data to the FB control operation unit 35 is longer than the first time difference. The time when the laser control unit 30 obtains the target wavelength data is, for example, a start time of the period A1, and corresponds to a third time in the present disclosure. The time when the laser control unit 30 inputs the target wavelength data to the FB control operation unit 35 is, for example, any time between start and end of the period F1, and corresponds to a fourth time in the present disclosure. The second time difference may be longer than a time interval for the laser control unit 30 to obtain the trigger signal. The second time difference may be longer than a time interval for the laser control unit 30 to obtain the target wavelength data.

2.4 Effect

According to the first embodiment, the laser control unit 30 calculates the wavelength deviation using the measured wavelength and the target wavelength data at a time before a time when the measured wavelength is obtained. This can suppress reduction in stability of a wavelength even if the target wavelength data when the calculation of the wavelength deviation and the PID operation are performed is different from the target wavelength data when the pulse laser beam is output.

Figure 9:
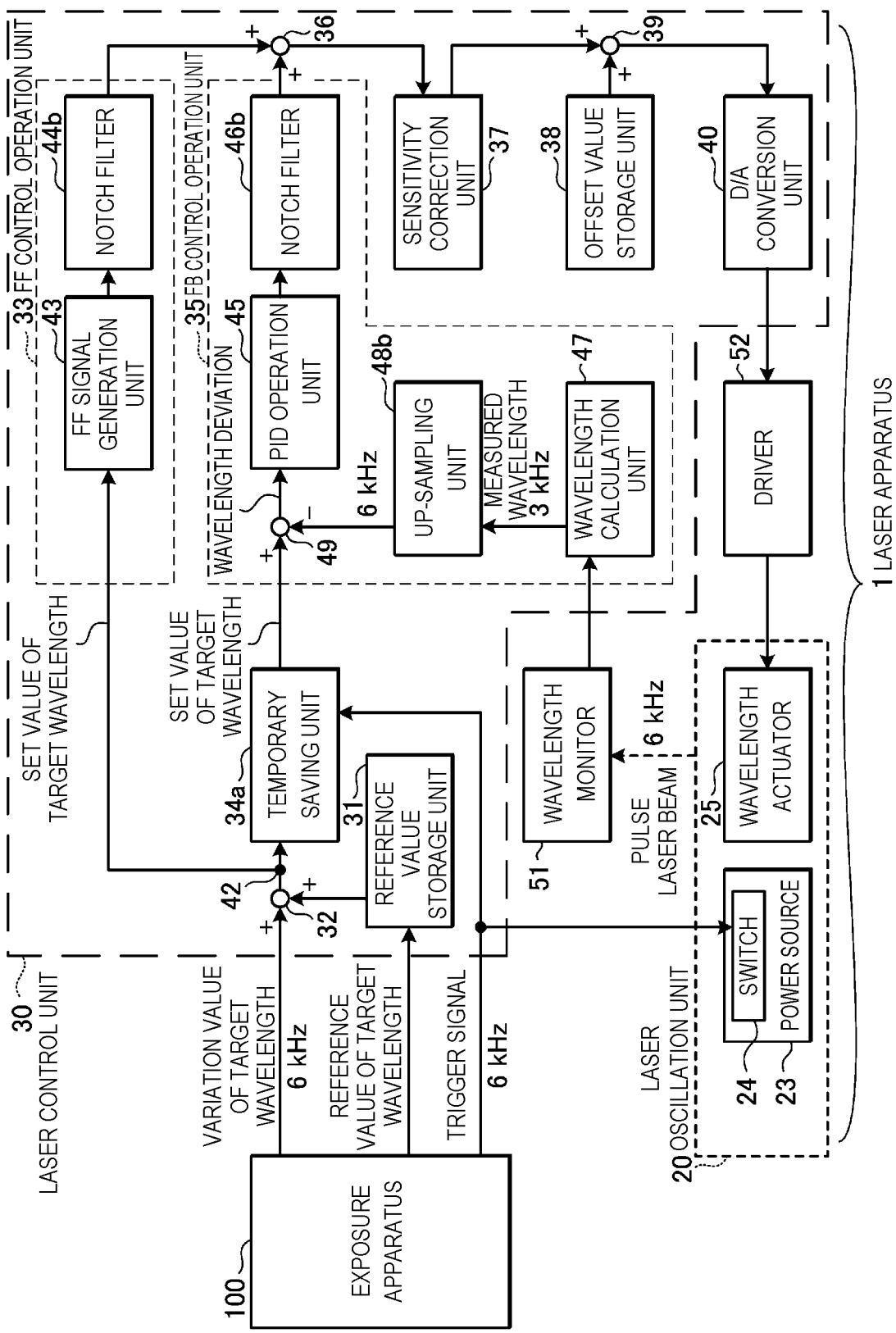
FIG. 9 is a block diagram of a laser control unit 30 in a second embodiment of the present disclosure.

3. Wavelength Control of Laser Apparatus to Reduce Predetermined Frequency Component Contained in Control Signal 3.1 Configuration of Laser Control Unit FIG. 9 is a block diagram of a laser control unit 30 in a second embodiment of the present disclosure. In the second embodiment, the FF control operation unit 33 in the laser control unit 30 includes a notch filter 44b. The FB control operation unit 35 in the laser control unit 30 includes a notch filter 46b and an up-sampling unit 48b. In the second embodiment, configurations and operations of the laser apparatus 1 other than the laser control unit 30 are the same as those in the comparative example described with reference to FIGS. 1 and 2.

The notch filter 44b is arranged between the addition unit 36 and the FF signal generation unit 43, the addition unit 36 adding an FF signal that is an output signal of the FF control operation unit 33 and an FB signal that is an output signal of the FB control operation unit 35. The notch filter 44b corresponds to a first notch filter in the present disclosure.

The notch filter 46b is arranged between the addition unit 36 and the PID operation unit 45. The notch filter 46b corresponds to a second notch filter in the present disclosure.

The up-sampling unit 48b is arranged between the addition unit 49 that calculates a wavelength deviation and the wavelength calculation unit 47.

For other points, the configuration of the laser control unit 30 in the second embodiment is the same as that of the first embodiment described with reference to FIG. 6.

3.2 Operation of Laser Control Unit

For example, given that a variation value of a target wavelength is output at a repetition frequency of 6 kHz from the exposure apparatus 100, the FF signal generation unit 43 outputs an FF signal at the repetition frequency of 6 kHz.

The FF signal is input to the notch filter 44b. The notch filter 44b reduces a frequency component containing a predetermined frequency from the FF signal output from the FF signal generation unit 43. The predetermined frequency is set to a value around a resonance frequency of the wavelength actuator 25. For example, when the wavelength actuator 25 has a resonance frequency of 2 kHz, the predetermined frequency is set to 2 kHz.

The notch filter 44b reduces the frequency component of 2 kHz from the FF signal of 6 kHz, thereby suppressing excitation of the wavelength actuator 25 by the resonance.

Also, for example, given that a trigger signal is output at a repetition frequency of 6 kHz from the exposure apparatus 100, the laser oscillation unit 20 outputs a pulse laser beam at the repetition frequency of 6 kHz.

However, for example, there may be a case that the wavelength calculation unit 47 can output a measured wavelength only at a repetition frequency of 3 kHz maximum. For example, when the wavelength monitor 51 outputs measurement data at the repetition frequency of 3 kHz, the wavelength calculation unit 47 outputs the measured wavelength at the repetition frequency of 3 kHz.

When the FB control operation unit 35 generates an FB signal at the repetition frequency of 3 kHz, a Nyquist frequency of the FB control operation unit 35 is half 3 kHz, that is, 1.5 kHz. In this case, even if the FB control operation unit 35 includes the notch filter 46b, it is difficult to reduce the frequency component of 2 kHz that is the resonance frequency of the wavelength actuator 25. This is because it is difficult for the notch filter 46b to reduce a frequency component higher than the Nyquist frequency.

In the second embodiment, the up-sampling unit 48b up-samples the measured wavelength to, for example, 6 kHz. Thus, the addition unit 49 can calculate a wavelength deviation at the repetition frequency of 6 kHz, and the PID operation unit 45 can output an FB signal at the repetition frequency of 6 kHz.

The FB signal is input to the notch filter 46b. The notch filter 46b reduces a frequency component containing a predetermined frequency from the FB signal. The predetermined frequency is set to a value around a resonance frequency of the wavelength actuator 25 similarly to the predetermined frequency reduced by the notch filter 44b. For example, the predetermined frequency is set to 2 kHz.

The measured wavelength is up-sampled to a repetition frequency more than twice the predetermined frequency, and the wavelength deviation is calculated using the up-sampled measured wavelength. Thus, the PID operation unit 45 outputs an FB signal at a repetition frequency more than twice the predetermined frequency. Thus, the notch filter 46b can reduce a frequency component containing the predetermined frequency. The notch filter 46b reduces the frequency component containing the predetermined frequency, thereby suppressing excitation of the wavelength actuator 25 by the resonance.

3.3 Effect

According to the second embodiment, the notch filters 44b, 46b reduce the predetermined frequency component contained in the control signal, thereby suppressing resonance of the wavelength actuator 25. This can improve stability of a wavelength.

Also, even if the frequency that is half the repetition frequency of the measured wavelength is lower than the resonance frequency of the wavelength actuator 25, the measured wavelength is up-sampled, thereby allowing the Nyquist frequency of the FB control operation unit 35 to be higher than the resonance frequency of the wavelength actuator 25. This can improve stability of feedback control and improve stability of a wavelength.

In the second embodiment, the case where the measured wavelength is up-sampled to 6 kHz has been described, but the present disclosure is not limited thereto. For example, the FB signal may be output at the repetition frequency of 6 kHz as in (1) to (4) below.

(1) Target wavelength data saved in the temporary saving unit 34a is down-sampled to generate target wavelength data at a repetition frequency of 3 kHz, which is equal to the repetition frequency of the measured wavelength output from the wavelength calculation unit 47.
(2) A wavelength deviation is calculated at the repetition frequency of 3 kHz using a measured wavelength at the repetition frequency of 3 kHz and target wavelength data.
(3) A wavelength deviation at the repetition frequency of 3 kHz is up-sampled to 6 kHz.
(4) PID operation is performed using a wavelength deviation at the repetition frequency of 6 kHz.

4. Others

Figure 10:
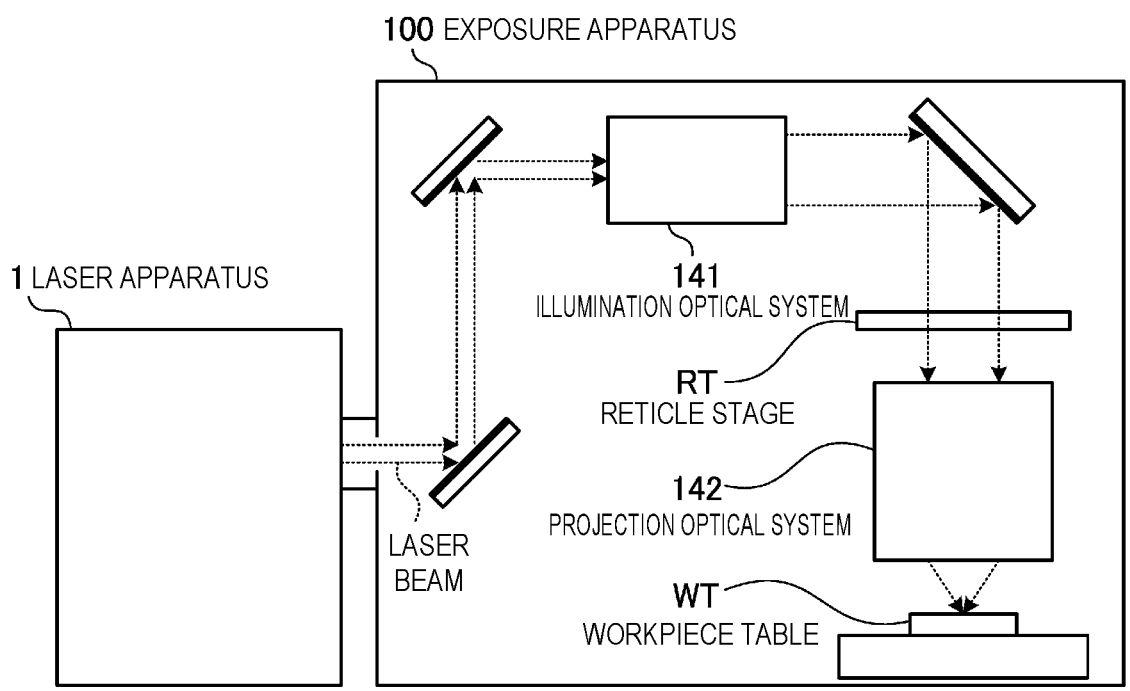
FIG. 10 schematically shows a configuration of an exposure apparatus 100 connected to a laser apparatus 1.

FIG. 10 schematically shows a configuration of an exposure apparatus 100 connected to the laser apparatus 1. As described above, the laser apparatus 1 generates a pulse laser beam and outputs the pulse laser beam to the exposure apparatus 100.

In FIG. 10, the exposure apparatus 100 includes an illumination optical system 141 and a projection optical system 142. The illumination optical system 141 illuminates, with a pulse laser beam incident from the laser apparatus 1, a reticle pattern on a reticle stage RT. The projection optical system 142 reduces and projects the pulse laser beam having passed though the reticle and forms an image thereof on a workpiece (not shown) arranged on a workpiece table WT. The workpiece is a photosensitive substrate such as a semiconductor wafer coated with photoresist. The exposure apparatus 100 synchronously translates the reticle stage RT and the workpiece table WT to expose the pulse laser beam reflecting the reticle pattern onto the workpiece. Through the exposure process as described above, a device pattern is transferred onto the semiconductor wafer, thereby manufacturing an electronic device.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more."

What is claimed is:

1. A wavelength control method of a laser apparatus, the wavelength control method comprising:
sequentially obtaining target wavelength data of a pulse laser beam at a first repetition frequency;
sequentially saving the target wavelength data;
sequentially measuring a wavelength of the pulse laser beam to obtain a measured wavelength at a second repetition frequency lower than the first repetition frequency;
calculating a wavelength deviation using the measured wavelength and the target wavelength data at a time before a time when the measured wavelength is obtained; and
feedback-controlling the wavelength of the pulse laser beam using the wavelength deviation.

2. The wavelength control method according to claim 1, wherein the target wavelength data is obtained from an exposure apparatus.

3. The wavelength control method according to claim 1, wherein the feedback control includes controlling a wavelength actuator to reduce the wavelength deviation.

4. The wavelength control method according to claim 3, wherein the wavelength actuator includes a piezoelectric element.

5. The wavelength control method according to claim 1, further comprising:
sequentially obtaining a trigger signal, which triggers output of each light pulse of the pulse laser beam, wherein
the target wavelength data is saved at a time when the trigger signal is obtained, and
the wavelength deviation is calculated using the target wavelength data at the time when the trigger signal is obtained.

6. The wavelength control method according to claim 5, wherein the trigger signal is obtained from an exposure apparatus.

7. The wavelength control method according to claim 1, further comprising:
sequentially obtaining a trigger signal including a first trigger pulse and a second trigger pulse after the first trigger pulse, wherein
the wavelength deviation is calculated using the measured wavelength obtained by measuring a wavelength of a light pulse output at timing when the first trigger pulse is obtained, and obtained after a time when the second trigger pulse is obtained.

8. The wavelength control method according to claim 7, wherein the wavelength deviation is calculated using the target wavelength data before the time when the second trigger pulse is obtained.

9. The wavelength control method according to claim 7, wherein the wavelength deviation is calculated using the target wavelength data at a time when the first trigger pulse is obtained.

10. The wavelength control method according to claim 1, further comprising:
inputting the target wavelength data at a first time to a feedforward control operation unit at a second time;
inputting the target wavelength data at a third time to a feedback control operation unit at a fourth time, a second time difference between the third time and the fourth time being longer than a first time difference between the first time and the second time; and
feedforward-controlling a wavelength of the pulse laser beam using the target wavelength data at the first time, wherein
the wavelength deviation is calculated using the target wavelength data at the third time.

11. The wavelength control method according to claim 10, wherein the second time difference is longer than a time interval for obtaining a trigger signal which triggers output of each light pulse of the pulse laser beam.

12. The wavelength control method according to claim 10, wherein the second time difference is longer than a time interval for obtaining the target wavelength data.

13. The wavelength control method according to claim 10, further comprising:
inputting an output signal of the feedforward control operation unit to a first notch filter to reduce a component of a predetermined frequency; and
inputting an output signal of the feedback control operation unit to a second notch filter to reduce the component of the predetermined frequency.

14. The wavelength control method according to claim 13, wherein the feedback control includes controlling a wavelength actuator to reduce the wavelength deviation, and
the predetermined frequency is a resonance frequency of the wavelength actuator.

15. The wavelength control method according to claim 13, further comprising:
up-sampling the measured wavelength to a repetition frequency more than twice the predetermined frequency, wherein
the wavelength deviation is calculated using the measured wavelength up-sampled.

16. The wavelength control method according to claim 1, further comprising:
up-sampling the measured wavelength to a repetition frequency higher than the second repetition frequency, wherein
the wavelength deviation is calculated using the measured wavelength up-sampled.

17. An electronic device manufacturing method comprising:
sequentially obtaining target wavelength data of a pulse laser beam at a first repetition frequency;
sequentially saving the target wavelength data;
sequentially measuring a wavelength of the pulse laser beam to obtain a measured wavelength at a second repetition frequency lower than the first repetition frequency;
calculating a wavelength deviation using the measured wavelength and the target wavelength data at a time before a time when the measured wavelength is obtained;
feedback-controlling the wavelength of the pulse laser beam using the wavelength deviation;
outputting the pulse laser beam to an exposure apparatus; and
exposing the pulse laser beam onto a photosensitive substrate within the exposure apparatus to manufacture an electronic device.

18. A wavelength control method of a laser apparatus, the wavelength control method comprising:
sequentially obtaining target wavelength data of a pulse laser beam;
sequentially saving the target wavelength data;

sequentially measuring a wavelength of the pulse laser beam to obtain a measured wavelength;

inputting the target wavelength data at a first time to a feedforward control operation unit at a second time;

inputting the target wavelength data at a third time to a feedback control operation unit at a fourth time, a second time difference between the third time and the fourth time being longer than a first time difference between the first time and the second time;

feedforward-controlling a wavelength of the pulse laser beam using the target wavelength data at the first time;

calculating a wavelength deviation using the measured wavelength and the target wavelength data at the third time, the third time being a time before the measured wavelength is obtained;

feedback-controlling the wavelength of the pulse laser beam using the wavelength deviation;

inputting an output signal of the feedforward control operation unit to a first notch filter to reduce a component of a predetermined frequency; and inputting an output signal of the feedback control operation unit to a second notch filter to reduce the component of the predetermined frequency.

19. The wavelength control method according to claim 18, wherein the feedback control includes controlling a wavelength actuator to reduce the wavelength deviation, and the predetermined frequency is a resonance frequency of the wavelength actuator.

20. The wavelength control method according to claim 18, further comprising:

up-sampling the measured wavelength to a repetition frequency more than twice the predetermined frequency, wherein the wavelength deviation is calculated using the measured wavelength up-sampled.

* * * * *